United States Patent
Tihanyi

(10) Patent No.: US 7,492,208 B2
(45) Date of Patent: Feb. 17, 2009

(54) MOSFET CIRCUIT HAVING REDUCED OUTPUT VOLTAGE OSCILLATIONS DURING A SWITCH-OFF OPERATION

(75) Inventor: Jenoe Tihanyi, Kirchheim (DE)

(73) Assignee: Infineon Technologies AG, Munich (DE)

( * ) Notice: Subject to any disclaimer, the term of this patent is extended or adjusted under 35 U.S.C. 154(b) by 742 days.

(21) Appl. No.: 10/757,974

(22) Filed: Jan. 15, 2004

(65) Prior Publication Data
US 2004/0212419 A1    Oct. 28, 2004

(30) Foreign Application Priority Data
Jan. 17, 2003    (DE) ................. 103 01 693

(51) Int. Cl.
*H03K 17/04* (2006.01)
(52) U.S. Cl. ............... 327/374; 327/375; 327/376; 327/377; 327/427
(58) Field of Classification Search ......... 327/380, 327/383, 384, 427, 374, 375, 376, 377
See application file for complete search history.

(56) References Cited

U.S. PATENT DOCUMENTS

| | | | | |
|---|---|---|---|---|
| 4,881,024 A | * | 11/1989 | Hartwick | 323/299 |
| 4,937,470 A | * | 6/1990 | Zeiler | 327/109 |
| 5,045,733 A | * | 9/1991 | Sendelweck | 327/308 |
| 5,359,655 A | * | 10/1994 | Rademaker et al. | 379/401 |
| 5,438,286 A | * | 8/1995 | Pavlin et al. | 327/50 |
| 5,917,254 A | * | 6/1999 | Lecce et al. | 307/125 |
| 6,084,462 A | * | 7/2000 | Barker | 327/512 |
| 6,285,246 B1 | * | 9/2001 | Basu | 327/541 |
| 6,444,504 B1 | * | 9/2002 | Zivic | 438/133 |
| 6,667,514 B2 | * | 12/2003 | Ahlers et al. | 257/336 |
| 6,825,105 B2 | * | 11/2004 | Grover et al. | 438/570 |
| 6,851,849 B2 | * | 2/2005 | Kimura | 374/163 |
| 6,855,981 B2 | * | 2/2005 | Kumar et al. | 257/328 |
| 2003/0006829 A1 | * | 1/2003 | Alessandria et al. | 327/538 |
| 2003/0089980 A1 | * | 5/2003 | Herfurth et al. | 257/724 |

FOREIGN PATENT DOCUMENTS

| | | |
|---|---|---|
| DE | 199 32 944 A1 | 2/2001 |
| DE | 199 45 432 A1 | 4/2001 |
| JP | 61-251 227 | 11/1986 |
| JP | 6-053 800 | * 2/1994 |
| JP | 06-053800 A | * 2/1994 |

* cited by examiner

*Primary Examiner*—Tuan T Lam
*Assistant Examiner*—Hiep Nguyen
(74) *Attorney, Agent, or Firm*—Maginot, Moore & Beck

(57) ABSTRACT

The invention relates to a MOSFET circuit having reduced output voltage oscillations, in which a smaller CoolMOS transistor (T2) with a zener diode (Z1) connected upstream of its gate is located in parallel with a larger CoolMOS transistor (T1), so that, during a switch-off operation, after the larger transistor has been switched off, the smaller transistor (T2) carries a tail current on account of the zener voltage still present, which tail current attenuates output oscillations of the voltage.

16 Claims, 3 Drawing Sheets

MOSFET CIRCUIT HAVING REDUCED OUTPUT VOLTAGE OSCILLATIONS DURING A SWITCH-OFF OPERATION

FIELD OF THE INVENTION

The present invention relates to a MOSFET circuit having reduced output voltage oscillations during a switch-off operation during which the current flowing through the circuit falls to zero.

BACKGROUND

In SMPSs (SMPS=Switched Mode Power Semiconductor or switched mode power supply) with MOSFETs, the switch-off thereof gives rise to high-frequency output oscillations which bring about interference and thus adversely affect the interference spectrum. This applies in particular to SMPSs which use compensation components, namely so-called CoolMOS-FETs, as MOSFETs.

Compared with SMPSs with CoolMOS-FETs, corresponding circuits with IGBTs are distinguished by a lower-interference switching behavior in which significantly fewer high-frequency output oscillations arise during switch-off.

FIG. 4 shows a MOSFET T, which is located with its source-gate path and a load L in series between a voltage source +U and a reference-ground potential and is driven at its gate G. If this MOSFET T is switched off at an instant t0, then a current I through the MOSFET falls steeply, while an output voltage Uout rises suddenly and exhibits high-frequency output oscillations especially in the case of a CoolMOS-FET, as is illustrated in FIG. 5.

By contrast, during switch-off an IGBT used instead of the MOSFET T supplies a so-called tail current Itail, which delays the fall in the current I after switch-off at the instant t0 and thus attenuates output oscillations of the output voltage Uout, so that the interference spectrum is adversely affected to a lesser extent in comparison with a CoolMOS-FET (cf. FIG. 6).

It is an object of the present invention to provide a MOSFET circuit, in particular for a switched mode power supply, which is distinguished by reduced output voltage oscillations during a switch-off operation, which is also intended to hold true when CoolMOS-FETs are used for the MOSFET circuit.

SUMMARY

This object is achieved according to the invention by means of a MOSFET circuit having the following:
- a first MOS transistor having a first number of cells,
- a second MOS transistor having a second number of cells, the second number being less than the first number and the second MOS transistor being provided with its source-drain path in parallel with the source-drain path of the first MOS transistor between a voltage source and refererence-ground potential, and
- a constant voltage element between gate of the first MOS transistor and gate of the second MOS transistor.

A zener diode may advantageously be used for the constant voltage element. A first resistor may be provided in parallel with said zener diode, so that a parallel circuit formed by the zener diode and the first resistor is present.

A second resistor may be arranged in series with the parallel circuit formed by the constant voltage element or the zener diode and the first resistor.

The zener diode and the first resistor may advantageously be integrated with one another. This may be done for example by the zener diode and the first resistor being formed by a highly doped polycrystalline layer of the first conduction type and a polycrystalline layer of the second conduction type that is in contact with the latter. In this case, the polycrystalline layer of the second conduction type may be located on the polysilicon gate plane of the MOSFET circuit.

Polycrystalline silicon on the polysilicon gate plane may likewise be used for the second resistor.

The first and second MOS transistors may advantageously be integrated into a chip or semiconductor body. Silicon, silicon carbide, compound semiconductor or another suitable semiconductor material may be used for the semiconductor body.

The doping concentration in the highly doped polycrystalline layer forming the zener diode and the first resistor and also in the polycrystalline layer of the second conduction type should not be higher than $10^{19}$ charge carriers $cm^{-3}$ in order in any event to avoid a short circuit.

The MOSFET circuit according to the invention is realized in a particularly advantageous manner with CoolMOS-FETs, since the reduction of the output voltages has a particularly advantageous effect therein.

BRIEF DESCRIPTION OF THE DRAWINGS

The invention is explained in more detail below with reference to the drawings, in which.

DETAILED DESCRIPTION

Figure 4:
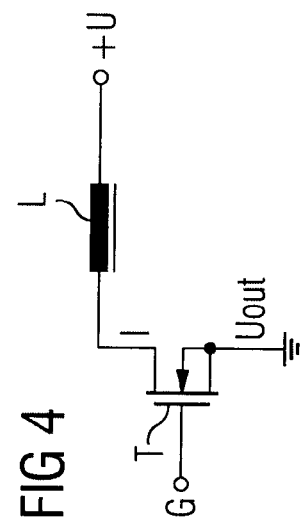
FIG. 4 shows a schematic circuit diagram with a CoolMOS-FET.
Figure 5:
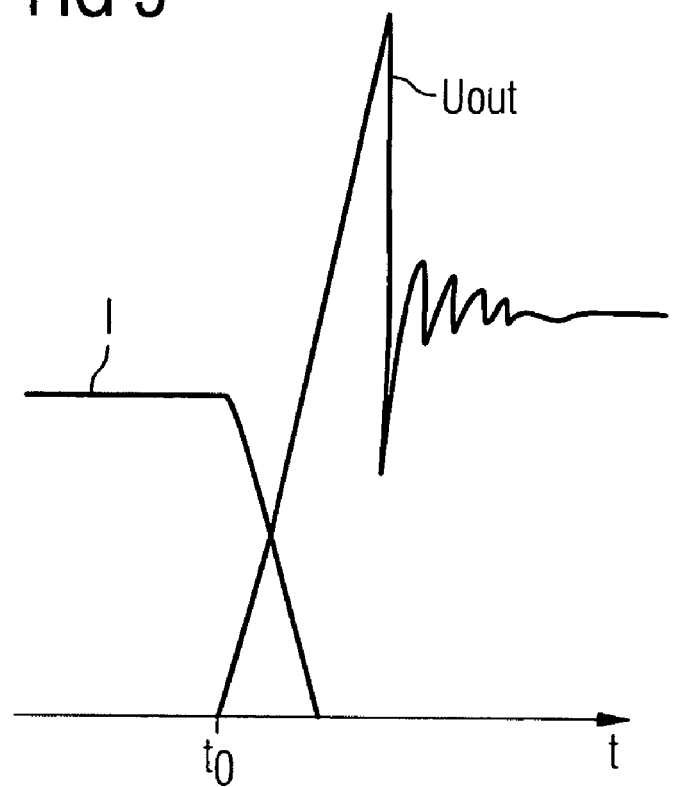
FIG. 5 shows a diagram for elucidating the switch-off behavior in the case of a MOSFET.
Figure 6:
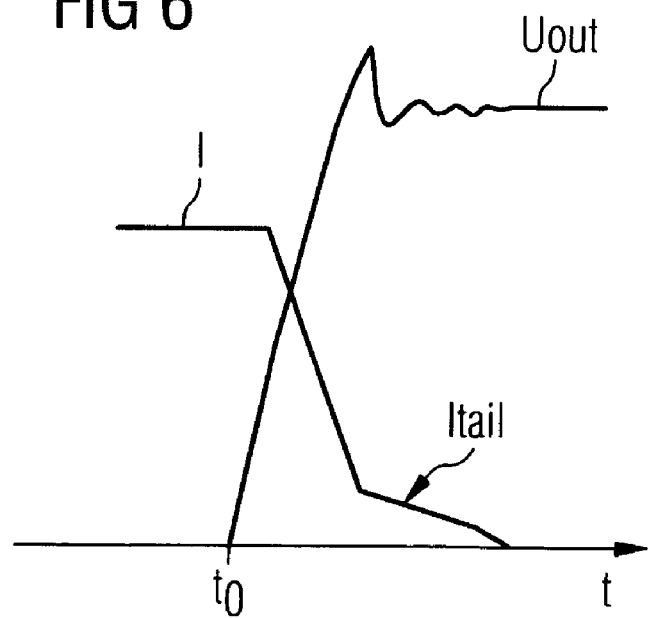
FIG. 6 shows a diagram for elucidating the switch-off behavior in the case of an IGBT.

FIGS. 4 to 6 have already been explained in the introduction.

In the figures, the same reference symbols are in each case used for mutually corresponding structural parts.

Figure 1:
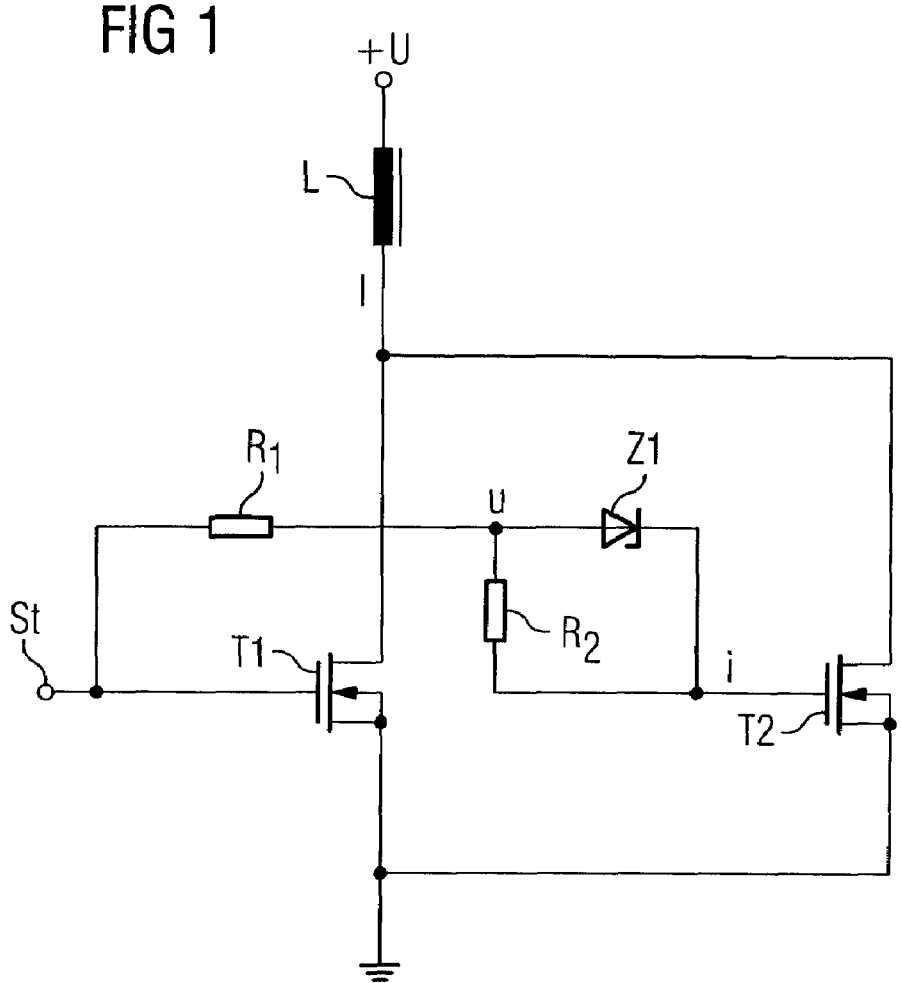
FIG. 1 shows a schematic circuit diagram of the MOSFET circuit according to the invention.

FIG. 1 shows an exemplary embodiment of the MOSFET circuit according to the invention with a first, "larger" MOS transistor T1 and a second, "smaller" MOS transistor T2. In this case, "larger" and "smaller" are to be understood such that the first MOS transistor T1 has more cells than the second MOS transistor T2. In this case, the first MOS transistor T1 may have more cells than the second MOS transistor T2 by a factor of 10, for example. However, it is also possible to provide only the value 2 or less or a value of more than 10 for said factor. By way of example, the transistor T1 may have 1000 cells. The transistor T2 may then be provided with about 100 cells.

The two MOS transistors T1 and T2 are located with their source-drain paths in parallel with one another between a voltage source +U and a reference-ground potential or ground.

A load L may additionally be provided between the parallel circuit formed by the two transistors T1 and T2 and the voltage source +U.

A control terminal St is connected to gate of the first MOS transistor T1 and, via a resistor R1 and the parallel circuit formed by a zener diode Z1 and a resistor R2, is connected to gate of the second MOS transistor T2. The resistor R1 may have a very low resistance and, if appropriate, also be omitted. Only the parallel circuit formed by the zener diode Z1 and the resistor R2 is then located between the control terminal St and gate of the MOS transistor T2.

The MOS transistors T1 and T2 are n-channel MOS transistors, for example, which, in particular, are preferably embodied using compensation technology. Thus, CoolMOS transistors are preferably used here.

If the two transistors T1 and T2 are both in the on state, then a current I flows from the voltage source +U via the load L and the parallel circuits of the two transistors T1 and T2 to reference-ground potential. In this case, these two transistors T1 and T2 are switched on practically simultaneously by a corresponding signal being applied to the control terminal St.

If the two transistors T1 and T2 are then switched off at an instant t0, the gate voltage drop at the transistor T2 is delayed by a certain time duration until after the gate voltage drop at the transistor T1, since the zener voltage of the zener diode Z1 is still present momentarily at the gate of the transistor T2. This means that the switch-off of the transistor T2 is delayed with respect to the switch-off of the transistor T1. A "tail current" thus continues to flow momentarily, so that a switch-off behavior corresponding to FIG. 6 for an IGBT is present for the MOSFET circuit of FIG. 1.

Figure 2:
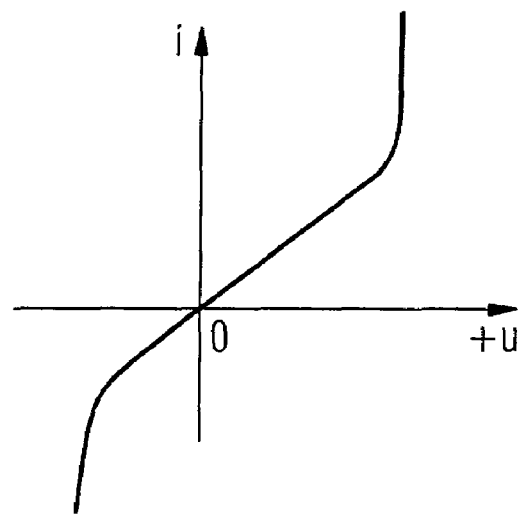
FIG. 2 shows the profile of the current/voltage characteristic curve of a zener diode in the case of the MOSFET circuit according to the invention.

Instead of the zener diode Z1, it is also possible to use a different constant voltage element provided that the latter has a characteristic curve as is illustrated for example in FIG. 2 for the current I as a function of the voltage u across the zener diode Z1.

The two transistors T1 and T2 are expediently integrated in a semiconductor body or on a chip. It is then advantageous also to integrate the resistor R1, the resistor R2 and the zener diode Z1 in the same semiconductor body or chip.

Figure 3:
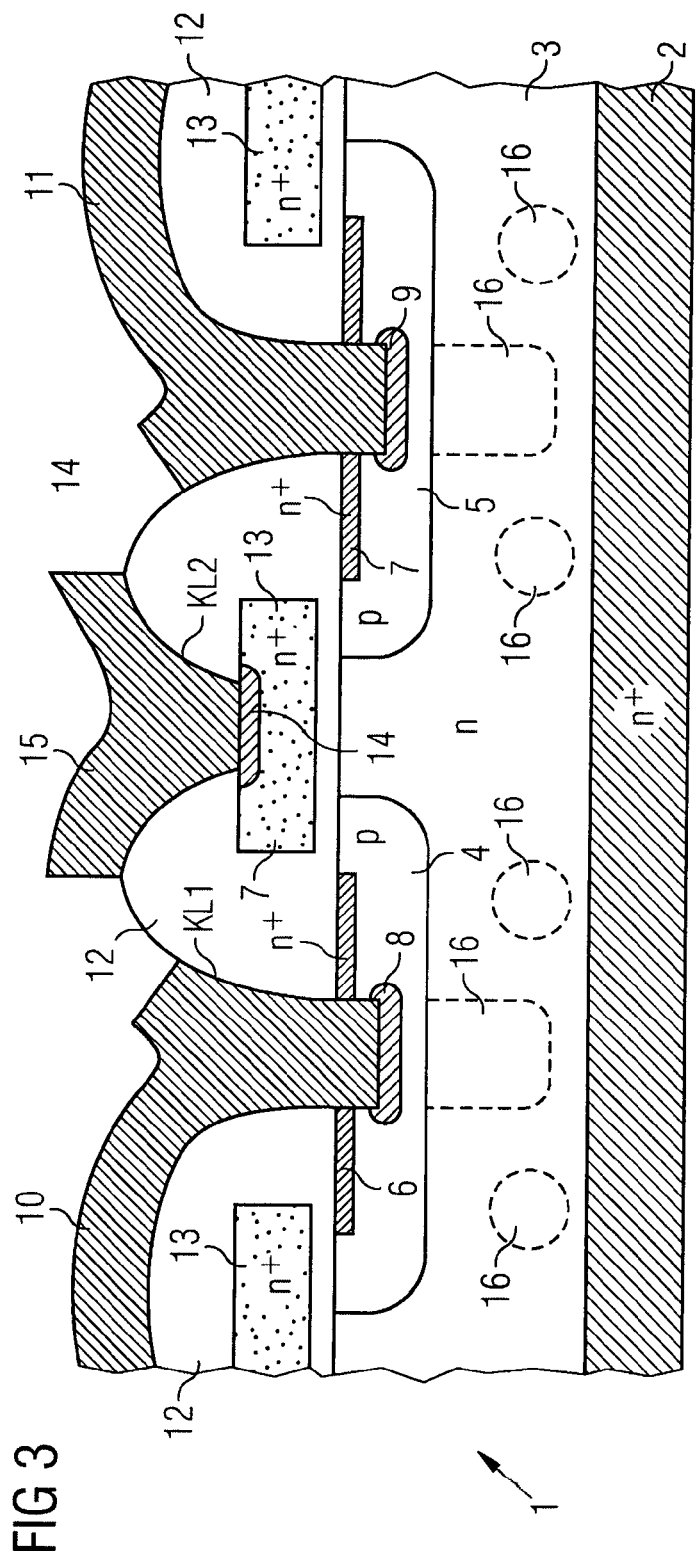
FIG. 3 shows a schematic sectional illustration through two transistor cells with a realization possibility for a zener diode.

One exemplary embodiment for this is shown in FIG. 3. It should be noted in this respect that the conduction types specified may in each case be reversed. Equally, instead of silicon, as has already been mentioned above, it is also possible to use another suitable semiconductor material.

Situated in a silicon body 1 with an $n^+$-conducting layer 2 and an n-conducting layer 3 there are p-conducting body regions 4, 5, in which respective $n^+$-conducting source zones 6, 7 and $p^+$-conducting body terminal regions 8, 9 are incorporated. Source metallizations 10, 11 made of aluminum, for example, are connected to the source zone 6 and, via the body terminal region 8, to the body region 4 and, respectively, to the source zone 7 and, via the body terminal region 9, to the body region 5.

The metallizations 10, 11 are essentially situated on an insulating layer 12 made of silicon dioxide, for example, in which gate electrodes 13 made of $n^+$-doped polycrystalline silicon are incorporated. One of said electrodes 13 may have a $p^+$-doped polycrystalline region 14, which thus forms a $p^+/n^+$ diode with zener-like behavior, that is to say the zener diode Z1. In this case, the pn junction between the region 14 and the region 13 constitutes the resistor R2.

The zener diode with resistor R2 formed by the regions 13, 14 is provided with a metallization 15.

The metallizations 10, 11 are introduced into the insulating layer 12 via first contact holes KL1, while the metallization 15 leads to the region 14 via second contact holes KL2 in the insulating layer 12.

It is also possible for p-doped compensation regions 16 to be embedded in the layer 3, which may provide for charge compensation in the drift path of the transistors and be floating or nonfloating.

FIG. 3 shows two cells of a transistor T1 or T2. Each of said transistors may have a multiplicity of such cells, zener diodes (cf. reference symbols 15, 14) only being incorporated in the cells of the transistor T2.

Since the MOS transistors T1 and T2 each have cells with an identical construction, for example corresponding to the diagram of FIG. 3, the MOS transistors T1 and T2 may readily be integrated in a single semiconductor body.

The resistor R1 may readily be realized by polycrystalline silicon on the insulating layer 11.

| List of reference symbols | |
|---|---|
| T1, T2 | MOS transistor |
| R1, R2 | Resistor |
| Z1 | Zener diode |
| St | Control terminal |
| U, u | Voltage |
| I, i | Current |
| L | Load |
| Uout | Output voltage |
| t0 | Instant |
| Itail | Tail current |
| 1 | Semiconductor body |
| 2 | Semiconductor layer |
| 3 | Semiconductor layer |
| 4, 5 | Body region |
| 6, 7 | Source zone |
| 8, 9 | Body terminal region |
| 10, 11 | Source metallization |
| 12 | Insulating layer |
| 13 | Gate electrode |
| 14 | $p^+$-conducting region |
| 15 | Metallization |
| KL1, KL2 | Contact hole |
| G | Gate |
| T | Transistor |

The invention claimed is:

1. A MOSFET circuit comprising:
a first MOS transistor having a first number of cells,
a second MOS transistor having a second number of cells, the second number being less than the first number and the second MOS transistor being provided with a source-drain path in parallel with a source-drain path of the first MOS transistor between a voltage source and reference potential,
a Zener diode coupled between a gate of the first MOS transistor and a gate of the second MOS transistor, wherein the Zener diode is further coupled between the gate of the second MOS transistor and a control input of the MOSFET circuit, and wherein the Zener diode is forward biased from the control input to the gate of the second MOS transistor,
a first resistor connected in parallel with the Zener diode, and
a second resistor connected in series with the parallel circuit formed by the Zener diode and the first resistor between the control input and the gate of the second MOS transistor.

2. The MOSFET circuit as claimed in claim 1, wherein the Zener diode and the first resistor are integrated with one another.

3. The MOSFET circuit as claimed in claim 2, wherein the Zener diode and the first resistor are formed by a highly doped polycrystalline layer of a first conduction type and a polycrystalline layer of a second conduction type that is in contact with the highly doped polycrystalline layer.

4. The MOSFET circuit as claimed in claim 3, wherein the polycrystalline layer of the second conduction type is located on a polysilicon gate plane of the MOSFET circuit.

5. The MOSFET circuit as claimed in claim 3, wherein a doping concentration of the highly doped layer is less than $10^{19}$ charge carriers $cm^{-3}$.

6. A MOSFET circuit comprising:
a first MOS transistor having a first number of cells, the first MOS transistor integrated into a semiconductor body;
a second MOS transistor having a second number of cells, the second MOS transistor integrated into the semiconductor body, the second number being less than the first number and the second MOS transistor being provided with a source-drain path in parallel with a source-drain path of the first MOS transistor between a voltage source and reference potential,
a Zener diode coupled between a gate of the first MOS transistor and a gate of the second MOS transistor, wherein the Zener diode is further coupled between the gate of the second MOS transistor and a control input of the MOSFET circuit, and wherein the Zener diode is forward biased from the control input to the gate of the second MOS transistor,
a first resistor connected in parallel with the Zener diode, and
a second resistor connected in series with the parallel circuit formed by the Zener diode and the first resistor between the control input and the gate of the second MOS transistor.

7. The MOSFET circuit as claimed in claim 6, wherein the first number of cells is at least twice the second number of cells.

8. The MOSFET circuit as claimed in claim 7, wherein the first number of cells is at least ten times the second number of cells.

9. The MOSFET circuit as claimed in claim 7, wherein the first number of cells is approximately 1000.

10. The MOSFET circuit as claimed in claim 6, wherein the first MOS transistor and the second MOS transistor comprise CoolMOS transistors.

11. The MOSFET circuit as claimed in claim 6, wherein the semiconductor body is of a second conduction type and charge compensation regions of a first conduction type are incorporated into the semiconductor body.

12. An integrated MOSFET circuit comprising:
a first MOS transistor having a first number of cells, said transistor being integrated in a semiconductor body,
a second MOS transistor having a second number of cells, said transistor being integrated in the semiconductor body, the second number being less than the first number and the second MOS transistor being provided with a source-drain path in parallel with a source- drain path of the first MOS transistor between a voltage source and a reference potential, and
a Zener diode connected between a gate of the first MOS transistor and a gate of the second MOS transistor, said Zener diode comprising a polycrystalline layer on a polycrystalline gate plane of the first and second MOS transistors and a zone provided in the polycrystalline layer and having an opposite conduction type to a conduction type of the polycrystalline layer, wherein the Zener diode is further coupled between the gate of the second MOS transistor and a control input of the MOSFET circuit, and wherein the Zener diode is forward biased from the control input to the gate of the second MOS transistor,
a first resistor connected in parallel with the Zener diode, and
a second resistor connected in series with the parallel circuit formed by the Zener diode and the first resistor between the control input and the gate of the second MOS transistor.

13. The integrated MOSFET circuit as claimed in claim 12, further comprising a resistor connected in parallel with the Zener diode, the resistor formed by the pn junction between the polycrystalline layer and the zone.

14. The integrated MOSFET circuit as claimed in claim 13, wherein the doping concentration of the zone is less than $10^{19}$ charge carriers $cm^{-3}$.

15. The MOSFET circuit as claimed in claim 12, wherein the first number of cells is at least twice the second number of cells.

16. The MOSFET circuit as claimed in claim 12, wherein the first number of cells is at least ten times the second number of cells.

* * * * *